United States Patent
Osanai

(10) Patent No.: US 7,304,378 B2
(45) Date of Patent: Dec. 4, 2007

(54) ALUMINUM/CERAMIC BONDING SUBSTRATE

(75) Inventor: Hideyo Osanai, Shiojiri (JP)

(73) Assignee: Dowa Mining Co., Ltd., Tokyo (JP)

( * ) Notice: Subject to any disclaimer, the term of this patent is extended or adjusted under 35 U.S.C. 154(b) by 112 days.

(21) Appl. No.: 11/208,246

(22) Filed: Aug. 19, 2005

(65) Prior Publication Data
US 2006/0043574 A1 Mar. 2, 2006

(30) Foreign Application Priority Data
Aug. 26, 2004 (JP) .............................. 2004-247005

(51) Int. Cl.
- *H01L 23/053* (2006.01)
- *H01L 23/12* (2006.01)
- *H01L 23/06* (2006.01)

(52) U.S. Cl. ................ 257/701; 257/703; 257/E23.009

(58) Field of Classification Search ................ 257/701, 257/703, E23.009
See application file for complete search history.

(56) References Cited

U.S. PATENT DOCUMENTS

| | | | |
|---|---|---|---|
| 5,652,877 A * | 7/1997 | Dubois et al. | 428/553 |
| 5,869,890 A | 2/1999 | Nishiura et al. | |
| 6,086,990 A | 7/2000 | Sumino et al. | |
| 6,113,730 A * | 9/2000 | Ohya et al. | 156/307.3 |
| 6,599,637 B1 | 7/2003 | Itoh et al. | |
| 6,613,443 B2 * | 9/2003 | Komatsu et al. | 428/469 |
| 6,613,450 B2 | 9/2003 | Tsukaguchi et al. | |
| 2002/0164488 A1 | 11/2002 | Furo et al. | |
| 2005/0117302 A1 * | 6/2005 | Emoto et al. | 361/704 |

FOREIGN PATENT DOCUMENTS

JP   2002-329814   11/2002

* cited by examiner

*Primary Examiner*—Nitin Parekh
(74) *Attorney, Agent, or Firm*—Bachman & LaPointe, P.C.

(57) ABSTRACT

There is provided an aluminum/ceramic bonding substrate having a high reliability to high-temperature heat cycles. An aluminum member of an aluminum alloy having a Vickers hardness of 35 to 45 is bonded to a ceramic substrate having a flexural strength of 500 to 600 MPa in three-point bending. The ceramic substrate is made of high-strength aluminum nitride, silicon nitride, alumina containing zirconia, or high-purity alumina. The aluminum alloy is an aluminum alloy containing silicon and boron, or an aluminum alloy containing copper.

12 Claims, 1 Drawing Sheet

FIGURE
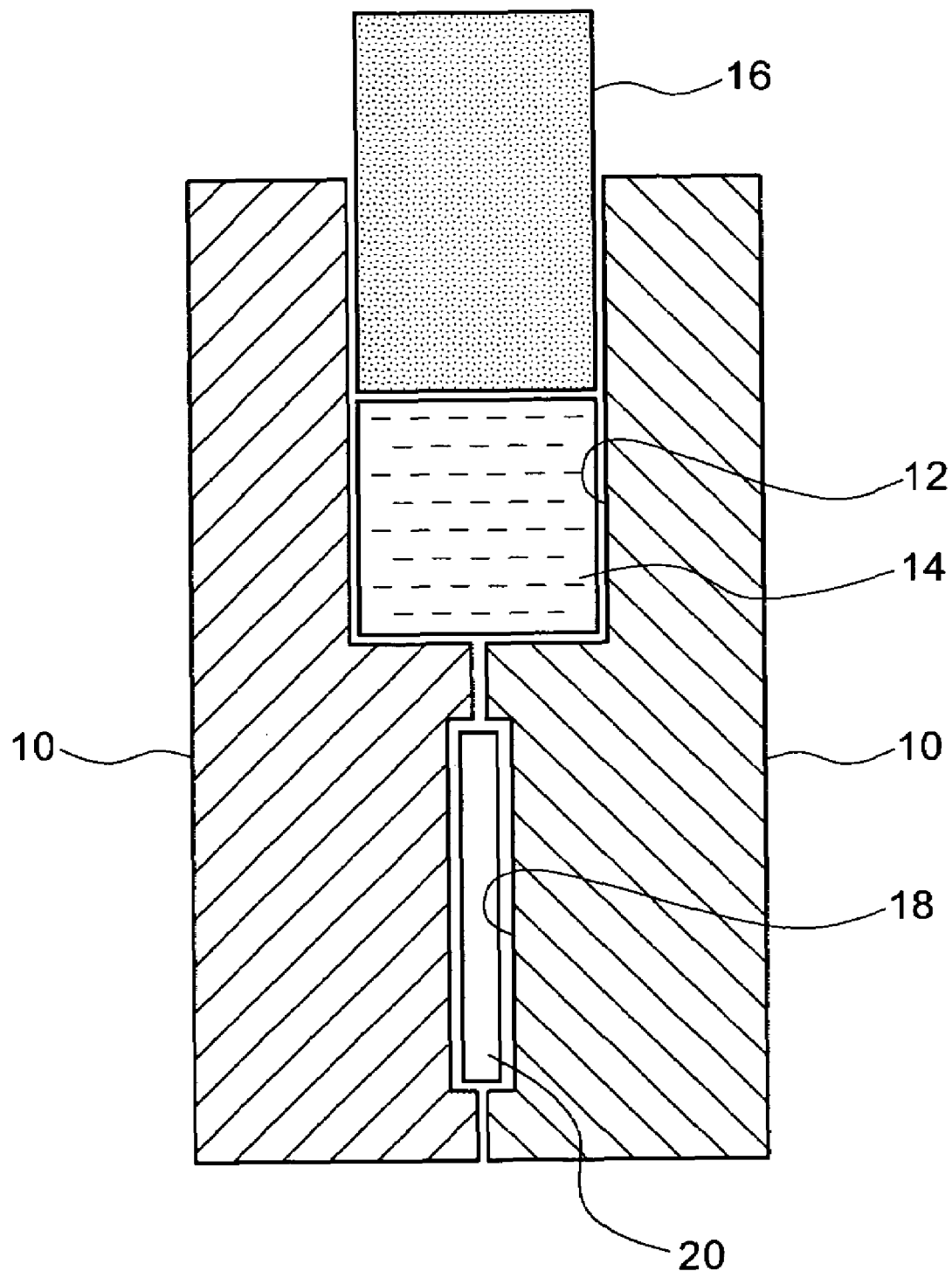

ALUMINUM/CERAMIC BONDING SUBSTRATE

BACKGROUND OF THE INVENTION

1. Field of the Invention

The present invention generally relates to an aluminum/ceramic bonding substrate wherein an aluminum member is bonded to a ceramic substrate. More specifically, the invention relates to an aluminum/ceramic bonding substrate used as an insulating substrate for a power module or the like.

2. Description of the Prior Art

In recent years, power modules are used for controlling heavy-current for electric vehicles, electric railcars, machine tools and so forth. In such a power module, a plurality of semiconductor chips are mainly mounted on a substrate to derive heavy-current. Therefore, substrates for fixing the semiconductor chips thereto must have a high electric insulation performance and a high radiating performance. In addition, the substrates must have a high reliability and a high durability since they are mounted on vehicles, electric railcars and so forth.

As one of indexes for evaluating such reliability and durability, there is a heat cycle test. In such a heat cycle test, thermal shocks are applied on a sample by changing temperature in a short time between the lowest and highest temperatures which are considered in a working environment. Even if such a thermal shock cycle is repeated, it is required to prevent the deterioration of the insulating and radiating performances of the substrate.

If a metal/ceramic bonding substrate having a metal member bonded to a ceramic substrate is used as an insulating substrate for fixing semiconductor chips thereto, when a heat cycle is applied on the bonding substrate, stress occurs on the bonding interface between the ceramic substrate and the metal member due to a difference in coefficient of thermal expansion between the metal and ceramic, so that there is the possibility that the ceramic substrate is finally broken. However, if an aluminum member is used as the metal member, the concentration of stress on the ceramic substrate is relaxed by easily deformable characteristics of aluminum, so that the reliability to the heat cycle is remarkably improved in comparison with a case where a copper member or the like is used as the metal member. For that reason, an aluminum/ceramic bonding substrate having an aluminum member bonded to a ceramic substrate is used as an insulating substrate for high reliable power modules for vehicles and electric railcars.

In a typical conventional power module, a metal/ceramic insulating substrate is fixed to one side of a base plate of a metal plate or composite material by soldering, and semiconductor chips are fixed to the metal/ceramic insulating substrate by soldering. In addition, a radiating fin or cooling jacket of a metal is mounted on the other side (reverse) of the base plate via a thermal conductive grease by means of screws or the like. However, if an aluminum/ceramic insulating substrate is used as the insulating substrate for the power module, there is the possibility that cracks may be produced in the solder layer to remarkably deteriorate the radiating performance of the power module to increase the temperature of the semiconductor chips to finally break the semiconductor chips. In order to prevent this, it is proposed that the Vickers hardness of an aluminum alloy member of an aluminum/ceramic bonding substrate is set to be 25 or more and less than 40 (see, e.g., Japanese Patent Laid-Open No. 2002-329814).

It is studied that semiconductor chips of compound semiconductors, such as SiC, AlGaN and GaN, resistant to a high temperature are used as semiconductor chips for power modules for use in vehicles and electric railcars in future. In such a case, it is studied that power modules having no cooling systems are used to reduce costs. As an insulating substrate for such power modules, it is required to provide an insulating substrate which has an electric insulating function, a circuit function and a cooling function and which is highly reliable to high-temperature heat cycles, particularly resistant to high-temperature heat cycles in each of which the substrate is sequentially held at −50° C. for 30 minutes, at 25° C. for 10 minutes, and at 300° C. for 30 minutes.

The aluminum/ceramic bonding substrate proposed in Japanese Patent Laid-Open No. 2002-329814 can be resistant to 3000 heat cycles or more, in each of which the substrate is sequentially held at −40° C. for 30 minutes, at 25° C. for 10 minutes, and at 125° C. for 30 minutes. However, this substrate can be resistant to only about 1000 high-temperature heat cycles on the above described conditions. It is considered that the reason for this is that the aluminum alloy of the aluminum/ceramic bonding substrate proposed in Japanese Patent Laid-Open No. 2002-329814 is soft to be broken although the ceramic substrate is not broken, so that the fatigue failure of the aluminum alloy occurs. That is, it is considered that the fatigue failure of the aluminum alloy of the aluminum/ceramic bonding substrate proposed in Japanese Patent Laid-Open No. 2002-329814 does not occur after 3000 heat cycles or more on the above described conventional heat cycle conditions, but the fatigue failure of the aluminum alloy occurs after about 1000 high-temperature heat cycles on the above described high-temperature heat cycle conditions.

SUMMARY OF THE INVENTION

It is therefore an object of the present invention to eliminate the aforementioned problems and to provide an aluminum/ceramic bonding substrate having a high reliability to high-temperature heat cycles.

In order to accomplish the aforementioned and other objects, the inventors have diligently studied and found that it is possible to provide an aluminum/ceramic bonding substrate having a high reliability to high-temperature heat cycles if an aluminum member having a Vickers hardness of 32 to 49 is bonded to a ceramic substrate having a flexural strength of 450 MPa or more in three-point bending. Thus, the inventors have made the present invention.

According to one aspect of the present invention, an aluminum/ceramic bonding substrate comprises: a ceramic substrate having a flexural strength of 450 MPa or more, preferably 470 MPa or more, and more preferably 500 MPa or more, in three-point bending; and an aluminum member bonded to the ceramic substrate, the aluminum member having a Vickers hardness of 32 to 49 and preferably 35 to 45.

In this aluminum/ceramic bonding substrate, the aluminum member is preferably made of an aluminum alloy. The aluminum alloy is preferably an aluminum alloy containing silicon and boron. In this case, the content of silicon is preferably in the range of from 0.6 wt % to 3.0 wt %, more preferably in the range of from 1.0 wt % to 2.0 wt %, and the content of boron is preferably in the range of from 0.01 wt % to 1.0 wt %, more preferably in the range of from 0.03 wt % to 0.05 wt %. Alternatively, the aluminum alloy may be an aluminum alloy containing copper. In this case, the content of copper is preferably in the range of from 0.6 wt % to 1.9 wt %, more preferably in the range of from 0.8 wt % to 1.5 wt %. Alternatively, the aluminum member may be made of aluminum.

The ceramic substrate is preferably made of a ceramic selected from the group consisting of aluminum nitride, silicon nitride, alumina containing zirconia, and high-purity alumina. The aluminum member preferably directly contacts the ceramic substrate to be bonded thereto, but the aluminum member may be bonded to the ceramic substrate via a brazing material.

The aluminum/ceramic bonding substrate is preferably used as a circuit board for mounting thereon a semiconductor chip which is made of SiC, AlGaN or GaN. The aluminum/ceramic bonding substrate may be used as a circuit board for an inverter or converter, or may be used as a circuit board for automotive parts.

According to the present invention, it is possible to provide an aluminum/ceramic bonding substrate having a high reliability to high-temperature heat cycles. In particular, it is possible to provide a highly reliable aluminum/ceramic bonding substrate capable of preventing the production of cracks in an aluminum alloy member and ceramic substrate to insure a high insulating performance and a high radiating performance even if high-temperature heat cycles are repeated 1000 times or more.

BRIEF DESCRIPTION OF THE DRAWING

FIGURE is a sectional view for explaining a method for producing an aluminum/ceramic bonding substrate in examples.

DESCRIPTION OF THE PREFERRED EMBODIMENTS

In a preferred embodiment of an aluminum/ceramic bonding substrate according to the present invention, an aluminum member of an aluminum alloy having a Vickers hardness of 32 to 49, preferably 35 to 45, is bonded directly to a ceramic substrate having a flexural strength of 450 MPa or more, preferably 470 MPa or more, and more preferably 500 MPa or more, in three-point bending.

When a high-temperature heat cycle test for repeating a cycle, in which an aluminum/ceramic bonding substrate is sequentially held at −50° C. for 30 minutes, at 25° C. for 10 minutes, and at 300° C. for 30 minutes, is carried out, an aluminum alloy is broken if the Vickers hardness of the aluminum alloy is less than 32, and stress applied to a ceramic substrate from the aluminum alloy is increased by high-temperature heat cycles to produce cracks in the ceramic substrate if the Vickers hardness of the aluminum alloy is higher than 49.

Therefore, in order to cause the aluminum/ceramic bonding substrate to be resistant to such high-temperature heat cycles, it is required for the aluminum alloy to have a Vickers hardness of Hv 32 to 49 to prevent the fatigue failure of the aluminum alloy, and it is also required to enhance the strength of the ceramic substrate, to which the aluminum member of such an aluminum alloy is bonded, to prevent the production of cracks, so that it is required for the ceramic substrate to have a flexural strength of 450 MPa or more in three-point bending.

As such a ceramic substrate, there is preferably used a ceramic substrate of high-strength aluminum nitride, silicon nitride, alumina containing zirconia, or high-purity alumina. Furthermore, the strength of the ceramic substrate is preferably higher in view of high-temperature heat cycle resistance.

As the aluminum member, there is preferably used an aluminum member of an aluminum alloy having the above described range of Vickers hardness. However, if an aluminum member of pure aluminum having a Vickers hardness of about 20 to 25 is used, the aluminum member may be worked and hardened by a surface treatment, such as shot peening, so as to enhance the Vickers hardness of the aluminum member in the above described range of Vickers hardness.

Furthermore, the composition of the aluminum alloy may be determined so as to satisfy the above described range of Vickers hardness. As the aluminum alloy satisfying the above described range of Vickers hardness, an aluminum alloy containing silicon and boron is preferably used. In this case, the content of silicon is preferably in the range of from 0.6 wt % to 3.0 wt %, and more preferably in the range of from 1.0 wt % to 2.0 wt %. The content of boron is preferably in the range of from 0.01 wt % to 1.0 wt %, and more preferably in the range of from 0.03 wt % to 0.05 wt %. Alternatively, as the aluminum alloy satisfying the above described range of Vickers hardness, an aluminum alloy containing copper may be used. In this case, the content of copper is preferably in the range of from 0.6 wt % to 1.9 wt %, and more preferably in the range of from 0.8 wt % to 1.5 wt %.

After the aluminum member is bonded to the ceramic substrate, the aluminum member may be patterned so as to have a predetermined circuit shape by etching or the like if necessary. Alternatively, the aluminum member previously worked so as to have a predetermined circuit shape may be bonded to the ceramic substrate. Moreover, the aluminum member is preferably plated by electroless plating or electroplating in order to improve the soldering performance of the aluminum member when semiconductor chips or the like are soldered on the aluminum member.

When an aluminum/ceramic bonding substrate is used as a circuit board, a ceramic substrate having a thickness of about 0.1 to 2 mm is generally used. In order to improve the reliability of the aluminum/ceramic bonding substrate to heat cycles, the ceramic substrate is preferably thicker. However, in view of the radiating performance of the aluminum/ceramic bonding substrate, the thickness of the ceramic substrate is preferably 0.8 mm or less, and more preferably 0.7 mm or less. When a silicon nitride substrate or a zirconia containing alumina substrate is used as the ceramic substrate, the thickness of the ceramic substrate is preferably 0.5 mm or less, and more preferably 0.35 mm or less, since such a ceramic substrate has a high toughness and a high reliability to heat cycles although it generally has a lower thermal conductivity than that of an aluminum nitride substrate.

As a method for bonding an aluminum member to a ceramic substrate to produce a preferred embodiment of an aluminum/ceramic bonding substrate according to the present invention, there may be used a method (molten-metal bonding method) for bonding an aluminum member directly to a ceramic substrate by causing molten aluminum to directly contact the ceramic substrate, a method (brazing method) for bonding an aluminum member to a ceramic substrate via a brazing filler metal, a method (direct bonding method) for bonding an aluminum member to a ceramic substrate by causing the aluminum member to directly contact the ceramic substrate in an inert atmosphere, or the like.

Throughout the specification, the term "flexural strength in three-point bending" of a ceramic substrate means a value calculated by the following expression after a three-point bending test based on JIS R1601 (Testing method for flexural strength (modulus of rupture) of fine ceramics) using a loading speed of 0.5 mm/min.

Flexural strength in three-point bending={3×maximum load at failure×span (distance between lower supporting points)}/{2×width of ceramic substrate×(thickness of ceramic substrate)$^2$}

The flexural strength of the ceramic substrate in three-point bending is a value calculated on the basis of a three-point bending test which is carried out with respect to the ceramic substrate before an aluminum member is bonded thereto. In order to obtain the flexural strength of the ceramic substrate in three-point bending after an aluminum member is bonded thereto, there may be used a value calculated on the basis of a three-point bending test which is carried out with respect to the ceramic substrate after the aluminum member of the aluminum/ceramic bonding substrate is melted with chemicals, such as iron chloride or copper chloride. Since ceramics have high chemical resistances, the flexural strength of the ceramic substrate in three-point bending before the aluminum member is bonded thereto is substantially equal to the flexural strength of the ceramic substrate in three-point bending after the aluminum member of the aluminum/ceramic bonding substrate is melted with chemicals (the difference therebetween is in the range of error).

Throughout the specification, the term "Vickers hardness" of an aluminum alloy means a Vickers hardness measured by loading an indenter of a Microvickers measuring apparatus on a surface of an aluminum member, which is polished (by mechanical polishing, chemical polishing, electropolishing or the like) after being bonded to a ceramic substrate, at a load of 100 g for ten seconds.

Examples of an aluminum/ceramic bonding substrate according to the present invention will be described below in detail.

EXAMPLE 1

As shown in the figure, an aluminum alloy material 14 consisting of 1 wt % of silicon, 0.04 wt % of boron and the rest being aluminum was put into an upper recessed portion 12 of a graphite mold 10, and a graphite piston 16 was mounted thereon. In addition, a ceramic substrate 20 of high-strength aluminum nitride (AlN) (a flexural strength of 500 MPa in three-point bending) having a size of 48 mm×38 mm×0.635 mm was mounted in a cavity 18 of the mold 10. Then, the mold 10 was put into a furnace heated at 800° C. After the aluminum alloy material 14 was melted to enter the cavity 18 by the weight of the piston 16, the mold 10 was taken out of the furnace to be cooled to a room temperature to prepare an aluminum/ceramic bonding substrate wherein aluminum alloy layers having a thickness of 0.5 mm were bonded to both sides of the ceramic substrate 20, respectively. The aluminum/ceramic bonding substrate thus prepared was mechanically polished and electropolished. Furthermore, heating and cooling were carried out in an atmosphere of nitrogen in order to prevent the oxidation of the graphite mold 10.

The surface of the aluminum alloy layer of the aluminum/ceramic bonding substrate thus prepared was polished, and the Vickers hardness of the aluminum alloy layer was measured by loading an indenter of a Microvickers measuring apparatus on the aluminum alloy layer at a load of 100 g for ten seconds. As a result, the Vickers hardness was Hv 35.8.

After etching resists having a predetermined shape were formed on the surfaces of the aluminum alloy layers to carry out etching to form a circuit pattern on one side and a pattern of a heat sink plate on the other side, Ni—P plating layers having a thickness of 3 μM m were formed on the aluminum alloy layers by electroless plating to prepare an aluminum/ceramic circuit board. After 3000 heat cycles (in each of which the aluminum/ceramic circuit board was sequentially held at −50° C. for 30 minutes, at 25° C. for 10 minutes, and at 300° C. for 30 minutes) were applied on the aluminum/ceramic circuit board, the ceramic substrate was normal, and the aluminum alloy layers were also normal.

EXAMPLE 2

An aluminum/ceramic bonding substrate was prepared by the same method as that in Example 1, except that a ceramic substrate of trisilicon tetranitride ($Si_3N_4$) (a flexural strength of 600 MPa in three-point bending) having a size of 48 mm×38 mm×0.32 mm was used as the ceramic substrate 20. After the Vickers hardness of the aluminum alloy layer of the aluminum/ceramic bonding substrate was measured by the same method as that in Example 1, the Vickers hardness was Hv 35.8. In addition, an aluminum/ceramic circuit board was prepared by the same method as that in Example 1, except that the aluminum/ceramic bonding substrate obtained in this example was used. After 3000 heat cycles were applied on the aluminum/ceramic circuit board similar to Example 1, the ceramic substrate was normal, and the aluminum alloy layers were also normal.

EXAMPLE 3

An aluminum/ceramic bonding substrate was prepared by the same method as that in Example 1, except that a ceramic substrate of alumina ($Al_2O_3$) containing 17 wt % of zirconium oxide ($ZrO_2$) (a flexural strength of 600 MPa in three-point bending) having a size of 48 mm×38 mm×0.25 mm was used as the ceramic substrate 20. After the Vickers hardness of the aluminum alloy layer of the aluminum/ceramic bonding substrate was measured by the same method as that in Example 1, the Vickers hardness was Hv 35.8. In addition, an aluminum/ceramic circuit board was prepared by the same method as that in Example 1, except that the aluminum/ceramic bonding substrate obtained in this example was used. After 3000 heat cycles were applied on the aluminum/ceramic circuit board similar to Example 1, the ceramic substrate was normal, and the aluminum alloy layers were also normal.

EXAMPLES 4-6

Aluminum/ceramic bonding substrates were prepared by the same methods as those in Examples 1, 2 and 3, respectively, except that an aluminum alloy material consisting of 2 wt % of silicon, 0.04 wt % of boron and the rest being aluminum was used. After the Vickers hardness of the aluminum alloy layer of each of the aluminum/ceramic bonding substrates was measured by the same method as that in Example 1, the Vickers hardness was Hv 41.2. In addition, aluminum/ceramic circuit boards were prepared by the same method as that in Example 1, except that the aluminum/ceramic bonding substrates obtained in these examples were used. After 3000 heat cycles were applied on each of the aluminum/ceramic circuit boards similar to Example 1, the ceramic substrate was normal, and the aluminum alloy layers were also normal.

COMPARATIVE EXAMPLE 1-3

Aluminum/ceramic bonding substrates were prepared by the same methods as those in Examples 1, 2 and 3, respectively, except that an aluminum alloy material consisting of 0.5 wt % of silicon, 0.04 wt % of boron and the rest being aluminum was used. After the Vickers hardness of the aluminum alloy layer of each of the aluminum/ceramic bonding substrates was measured by the same method as that in Example 1, the Vickers hardness was Hv 30.9. In addition, aluminum/ceramic circuit boards were prepared by the same method as that in Example 1, except that the aluminum/ceramic bonding substrates obtained in these examples were used. After 3000 heat cycles were applied on each of the aluminum/ceramic circuit boards similar to Example 1, cracks were produced in the vicinity of the bonding interface between the aluminum alloy layer and the ceramic substrate although the ceramic substrate was normal.

EXAMPLES 7-9

Aluminum/ceramic bonding substrates were prepared by the same methods as those in Examples 1, 2 and 3, respectively, except that an aluminum alloy material consisting of 1 wt % of copper and the rest being aluminum was used. After the Vickers hardness of the aluminum alloy layer of each of the aluminum/ceramic bonding substrates was measured by the same method as that in Example 1, the Vickers hardness was Hv 37.5. In addition, aluminum/ceramic circuit boards were prepared by the same method as that in Example 1, except that the aluminum/ceramic bonding substrates obtained in these examples were used. After 3000 heat cycles were applied on each of the aluminum/ceramic circuit boards similar to Example 1, the ceramic substrate was normal, and the aluminum alloy layers were also normal.

COMPARATIVE EXAMPLES 4-6

Aluminum/ceramic bonding substrates were prepared by the same methods as those in Examples 1, 2 and 3, respectively, except that an aluminum alloy material consisting of 0.5 wt % of copper and the rest being aluminum was used. After the Vickers hardness of the aluminum alloy layer of each of the aluminum/ceramic bonding substrates was measured by the same method as that in Example 1, the Vickers hardness was Hv 31.6. In addition, aluminum/ceramic circuit boards were prepared by the same method as that in Example 1, except that the aluminum/ceramic bonding substrates obtained in these examples were used. After 3000 heat cycles were applied on each of the aluminum/ceramic circuit boards similar to Example 1, cracks were produced in part of the aluminum alloy layers although the ceramic substrate was normal.

COMPARATIVE EXAMPLES 7-9

Aluminum/ceramic bonding substrates were prepared by the same methods as those in Examples 1, 2 and 3, respectively, except that an aluminum alloy material consisting of 2 wt % of copper and the rest being aluminum was used. After the Vickers hardness of the aluminum alloy layer of each of the aluminum/ceramic bonding substrates was measured by the same method as that in Example 1, the Vickers hardness was Hv 49.1. In addition, aluminum/ceramic circuit boards were prepared by the same method as that in Example 1, except that the aluminum/ceramic bonding substrates obtained in these examples were used. After 3000 heat cycles were applied on each of the aluminum/ceramic circuit boards similar to Example 1, shell-shaped cracks were produced in the ceramic substrate. However, insulation performance was normal.

COMPARATIVE EXAMPLE 10

An aluminum/ceramic bonding substrate was prepared by the same method as that in Example 1, except that a ceramic substrate of aluminum nitride (AlN) having a flexural strength of 350 MPa in three-point bending was used as the ceramic substrate 20. After the Vickers hardness of the aluminum alloy layer of the aluminum/ceramic bonding substrate was measured by the same method as that in Example 1, the Vickers hardness was Hv 30.9. In addition, an aluminum/ceramic circuit board was prepared by the same method as that in Example 1, except that the aluminum/ceramic bonding substrate obtained in this example was used. After 3000 heat cycles were applied on the aluminum/ceramic circuit board similar to Example 1, cracks were produced in the aluminum alloy layers.

COMPARATIVE EXAMPLE 11

An aluminum/ceramic bonding substrate was prepared by the same method as that in Example 1, except that a ceramic substrate of aluminum nitride (AlN) having a flexural strength of 420 MPa in three-point bending was used as the ceramic substrate 20. After the Vickers hardness of the aluminum alloy layer of the aluminum/ceramic bonding substrate was measured by the same method as that in Example 1, the Vickers hardness was Hv 30.9. In addition, an aluminum/ceramic circuit board was prepared by the same method as that in Example 1, except that the aluminum/ceramic bonding substrate obtained in this example was used. After 3000 heat cycles were applied on the aluminum/ceramic circuit board similar to Example 1, cracks were produced in the aluminum alloy layers.

COMPARATIVE EXAMPLE 12

An aluminum/ceramic bonding substrate was prepared by the same method as that in Comparative Example 7, except that a ceramic substrate of aluminum nitride (AlN) having a flexural strength of 350 MPa in three-point bending was used as the ceramic substrate 20. After the Vickers hardness of the aluminum alloy layer of the aluminum/ceramic bonding substrate was measured by the same method as that in Example 1, the Vickers hardness was Hv 49.1. In addition, an aluminum/ceramic circuit board was prepared by the same method as that in Example 1, except that the aluminum/ceramic bonding substrate obtained in this example was used. After 3000 heat cycles were applied on the aluminum/ceramic circuit board similar to Example 1, cracks were produced so as to pass through the ceramic substrate.

COMPARATIVE EXAMPLE 13

An aluminum/ceramic bonding substrate was prepared by the same method as that in Comparative Example 7, except that a ceramic substrate of aluminum nitride (AlN) having a flexural strength of 420 MPa in three-point bending was used as the ceramic substrate 20. After the Vickers hardness of the aluminum alloy layer of the aluminum/ceramic bonding substrate was measured by the same method as that in Example 1, the Vickers hardness was Hv 49.1. In addition, an aluminum/ceramic circuit board was prepared by the same method as that in Example 1, except that the aluminum/ceramic bonding substrate obtained in this example was used. After 3000 heat cycles were applied on the aluminum/ceramic circuit board similar to Example 1, cracks were produced so as to pass through the ceramic substrate.

The results in these examples and comparative examples are shown in Table. In Table, "good" is shown when no cracks were produced after 3000 high-temperature heat cycles are applied, i.e., when the radiating performance and insulating performance were good. In addition, "no good" is shown when cracks were produced in the aluminum alloy layers, and/or shell-shaped cracks were produced in the ceramic substrate, so that the radiating performance was deteriorated. Moreover, "vary bad" is shown when cracks were produced so as to pass through the ceramic substrate, so that dielectric breakdown being critical failure was caused.

What is claimed is:

1. An aluminum/ceramic bonding substrate comprising:
    a ceramic substrate having a flexural strength of 450 MPa or more in three-point bending; and
    an aluminum member bonded to said ceramic substrate, said aluminum member having a Vickers hardness of 32 to 49,
    wherein said aluminum member is made of an aluminum alloy containing contains 0.6 to 3.0 wt % of silicon and 0.01 to 1.0 wt % of boron.
2. An aluminum/ceramic bonding substrate as set forth in claim 1, wherein said Vickers hardness of said aluminum member is in the range of from 35 to 45.
3. An aluminum/ceramic bonding substrate as set forth in claim 1, wherein said flexural strength of said ceramic substrate is 470 MPa or more.
4. An aluminum/ceramic bonding substrate as set forth in claim 1, wherein said flexural strength of said ceramic substrate is 500 MPa or more.
5. An aluminum/ceramic bonding substrate as set forth in claim 1, wherein said aluminum alloy contains 1.0 to 2.0 wt % of silicon and 0.03 to 0.05 wt % of boron.
6. An aluminum/ceramic bonding substrate as set forth in claim 1, wherein said ceramic substrate is made of a ceramic

TABLE

| | Al alloy | | ceramics | | | 3000 high-temp. |
|---|---|---|---|---|---|---|
| | composition (wt %) | Hv | thickness (mm) | composition | flexural strength (MPa) | heat cycles |
| Comp. 1 | 0.5Si—0.04B | 30.9 | 0.635 | AlN | 500 | no good |
| Comp. 2 | 0.5Si—0.04B | 30.9 | 0.32 | $Si_3N_4$ | 600 | no good |
| Comp. 3 | 0.5Si—0.04B | 30.9 | 0.25 | $ZrO_2$(17 wt %) $Al_2O_3$ | 600 | no good |
| Ex. 1 | 1Si—0.04B | 35.8 | 0.635 | AlN | 500 | good |
| Ex. 2 | 1Si—0.04B | 35.8 | 0.32 | $Si_3N_4$ | 600 | good |
| Ex. 3 | 1Si—0.04B | 35.8 | 0.25 | $ZrO_2$(17 wt %) $Al_2O_3$ | 600 | good |
| Ex. 4 | 2Si—0.04B | 41.2 | 0.635 | AlN | 500 | good |
| Ex. 5 | 2Si—0.04B | 41.2 | 0.32 | $Si_3N_4$ | 600 | good |
| Ex. 6 | 2Si—0.04B | 41.2 | 0.25 | $ZrO_2$(17 wt %) $Al_2O_3$ | 600 | good |
| Comp. 4 | 0.5Cu | 31.6 | 0.635 | AlN | 500 | no good |
| Comp. 5 | 0.5Cu | 31.6 | 0.32 | $Si_3N_4$ | 600 | no good |
| Comp. 6 | 0.5Cu | 31.6 | 0.25 | $ZrO_2$(17 wt %) $Al_2O_3$ | 600 | no good |
| Ex. 7 | 1Cu | 37.5 | 0.635 | AlN | 500 | good |
| Ex. 8 | 1Cu | 37.5 | 0.32 | $Si_3N_4$ | 600 | good |
| Ex. 9 | 1Cu | 37.5 | 0.25 | $ZrO_2$(17 wt %) $Al_2O_3$ | 600 | good |
| Comp. 7 | 2Cu | 49.1 | 0.635 | AlN | 500 | no good |
| Comp. 8 | 2Cu | 49.1 | 0.32 | $Si_3N_4$ | 600 | no good |
| Comp. 9 | 2Cu | 49.1 | 0.25 | $ZrO_2$(17 wt %) $Al_2O_3$ | 600 | no good |
| Comp. 10 | 0.5Si—0.04B | 30.9 | 0.635 | AlN | 350 | no good |
| Comp. 11 | 0.5Si—0.04B | 30.9 | 0.635 | AlN | 420 | no good |
| Comp. 12 | 2Cu | 49.1 | 0.635 | AlN | 350 | Very bad |
| Comp. 13 | 2Cu | 49.1 | 0.635 | AlN | 420 | Very bad | selected from the group consisting of aluminum nitride, silicon nitride, alumina containing zirconia, and high-purity alumina.

7. An aluminum/ceramic bonding substrate as set forth in claim 1, wherein said aluminum member directly contacts said ceramic substrate to be bonded thereto.

8. An aluminum/ceramic bonding substrate as set forth in claim 1, wherein said aluminum member is bonded to said ceramic substrate via a brazing material.

9. An aluminum/ceramic bonding substrate as set forth in claim 1, which is used as a circuit board for mounting thereon a semiconductor chip.

10. An aluminum/ceramic bonding substrate as set forth in claim 9, wherein said semiconductor chip is made of SiC, AlGaN or GaN.

11. An aluminum/ceramic bonding substrate as set forth in claim 1, which is used as a circuit board for an inverter or converter.

12. An aluminum/ceramic bonding substrate as set forth in claim 1, which is used as a circuit board for automotive parts.

* * * * *